(12) United States Patent
Kuo et al.

(10) Patent No.: US 9,368,365 B1
(45) Date of Patent: Jun. 14, 2016

(54) METHOD FOR FORMING A SEMICONDUCTOR STRUCTURE

(71) Applicant: UNITED MICROELECTRONICS CORP., Hsin-Chu (TW)

(72) Inventors: Shih-Hsun Kuo, Kaohsiung (TW);
Ting-Cheng Tseng, Tainan (TW);
Tan-Ya Yin, Nantou County (TW);
Chia-Wei Huang, Kaohsiung (TW);
Ming-Jui Chen, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/709,488

(22) Filed: May 12, 2015

(51) Int. Cl.
*H01L 21/30* (2006.01)
*H01L 21/308* (2006.01)

(52) U.S. Cl.
CPC ........ *H01L 21/3086* (2013.01); *H01L 21/3085* (2013.01)

(58) Field of Classification Search
CPC ................. H01L 21/3085; H01L 21/3086
See application file for complete search history.

(56) References Cited

U.S. PATENT DOCUMENTS

| 7,820,550 | B2 | 10/2010 | Nyhus | |
|---|---|---|---|---|
| 7,856,613 | B1 | 12/2010 | Weling | |
| 7,883,834 | B2 | 2/2011 | Hagiwara | |
| 2014/0264717 | A1* | 9/2014 | Shieh | H01L 29/06 257/499 |
| 2015/0044829 | A1* | 2/2015 | Kim | H01L 21/823807 438/199 |

* cited by examiner

*Primary Examiner* — Nadine Norton
*Assistant Examiner* — Mahmoud Dahimene
(74) *Attorney, Agent, or Firm* — Winston Hsu; Scott Margo

(57) ABSTRACT

A manufacturing method for forming a semiconductor structure includes: first, a plurality of fin structures are formed on a substrate and arranged along a first direction, next, a first fin cut process is performed, so as to remove parts of the fin structures which are disposed within at least one first fin cut region, and a second fin cut process is then performed, so as to remove parts of the fin structures which are disposed within at least one second fin cut region, where the second fin cut region is disposed along at least one edge of the first fin cut region.

10 Claims, 6 Drawing Sheets

METHOD FOR FORMING A SEMICONDUCTOR STRUCTURE

BACKGROUND OF THE INVENTION

1. Field of the Invention

The present invention relates to a manufacturing method for forming a semiconductor structure, and in particular, to a method for forming a semiconductor structure with a more precise critical dimension (CD).

2. Description of the Prior Art

With increasing miniaturization of semiconductor devices, various Multi-gate MOSFET devices have been developed. The Multi-gate MOSFET is advantageous for the following reasons. Manufacturing processes of Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This reduces both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel to each other. With the demands of miniaturization of semiconductor devices, the width of each fin-shaped structure narrows and the spacing between the fin-shaped structures shrinks. Thus, forming fin-shaped structures which can achieve the required demands under the restrictions of miniaturization, physical limitations and various processing parameters becomes an extreme challenge.

SUMMARY OF THE INVENTION

The present invention provides a manufacturing method for forming a semiconductor structure, comprising the following steps: first, a plurality of fin structures are formed on a substrate and arranged along a first direction, next, a first fin cut process is performed, so as to remove parts of the fin structures which are disposed within at least one first fin cut region, and a second fin cut process is then performed, so as to remove parts of the fin structures which are disposed within at least one second fin cut region, wherein the second fin cut region is disposed along at least one edge of the first fin cut region.

The present invention provides a method for forming a semiconductor structure, which at least comprises the first fin cut process P1 and the second fin cut process P2. After the first fin cut process P1 is performed, parts of the fin structures are removed, but the critical dimension of the first fin cut region R1 is still relatively rough. Therefore the second fin cut process P2 is further performed, so as to modify the edge region of the first fin cut region R1, and control the critical dimension better, thereby improving the quality of the semiconductor devices.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
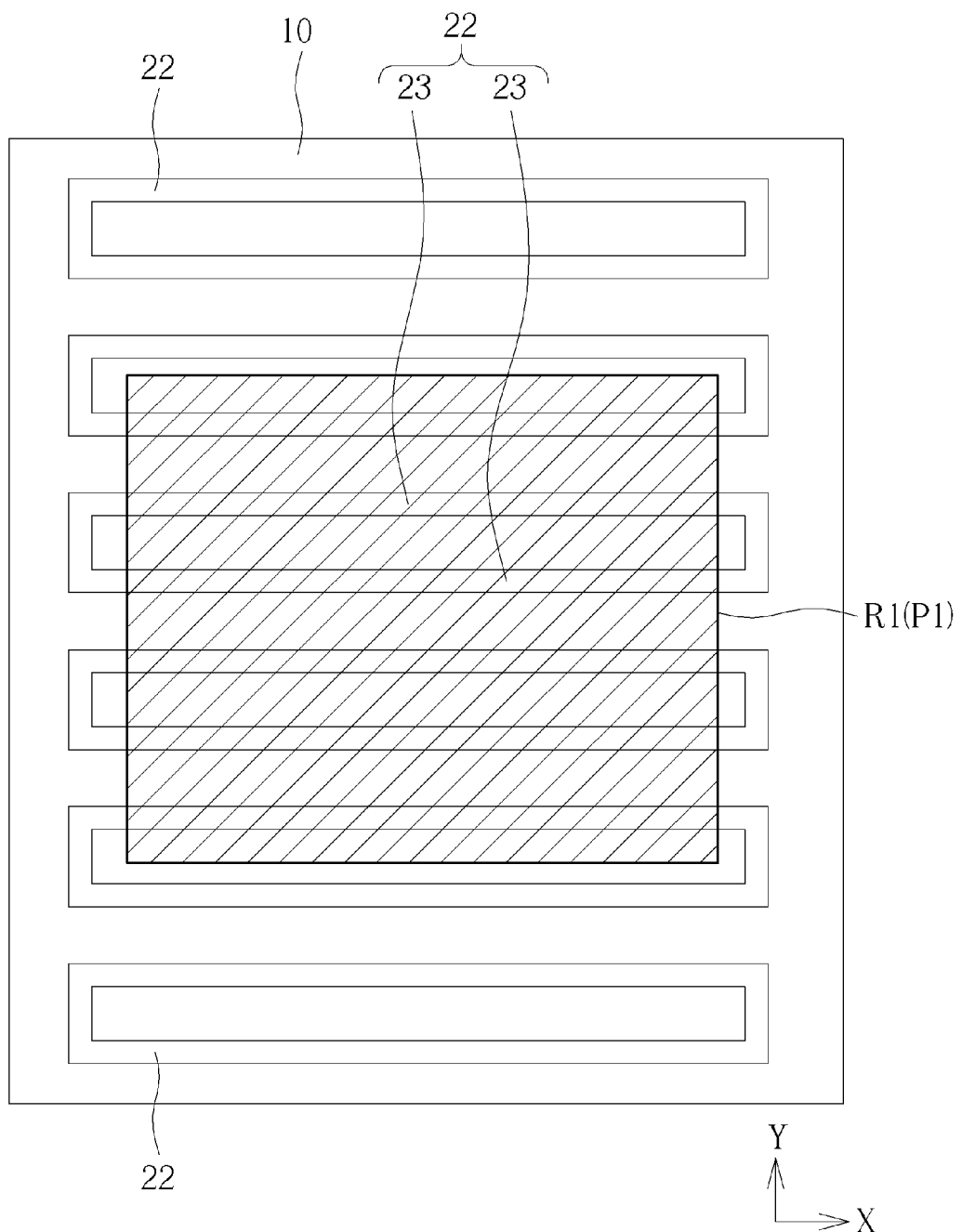
FIG. 1 is a top view diagram according to the first preferred embodiment of the present invention.

FIG. 1 is a top view diagram according to the first preferred embodiment of the present invention. At the beginning of the present invention, as shown in FIG. FIG. 1, a substrate 10 is provided. The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. And a plurality of rectangle frame-shaped fin structures 22 are disposed on the substrate 10 and arranged parallel to each other. In addition, the rectangle frame-shaped fin structure 22 can be formed through a sidewall image transfer (SIT) process. More precisely, please refer to FIGS. 1A-1D, which are cross section diagrams for forming the rectangle frame-shaped fin structures 22 on the substrate 10 through the sidewall image transfer (SIT) process.

Figure 1A:
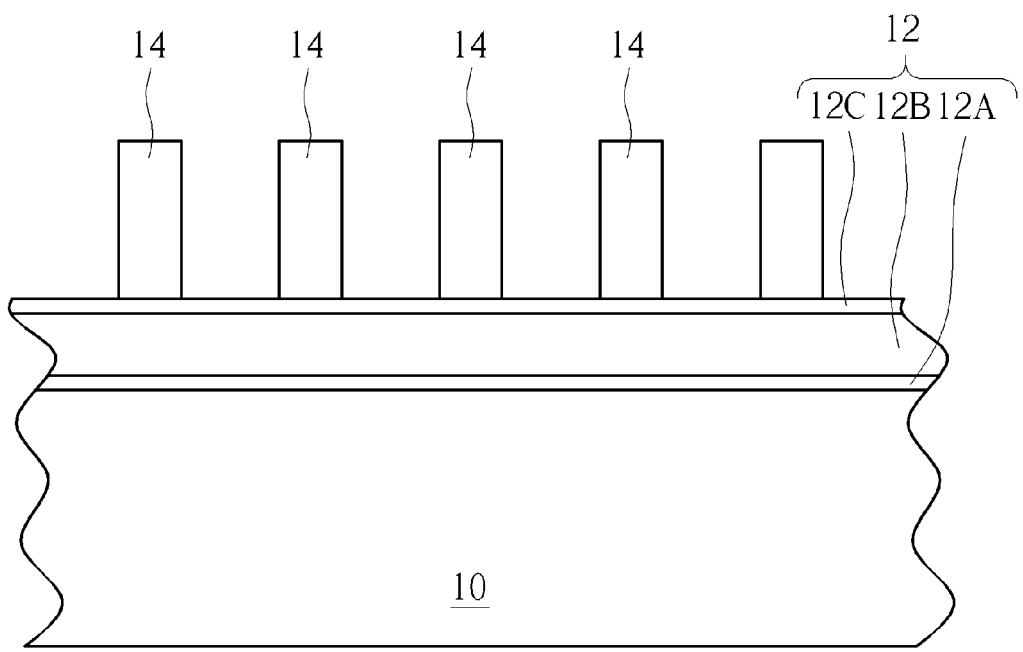
FIGS. 1A-1D are cross section diagrams for forming the fin structures on the substrate through the sidewall image transfer (SIT) process.

As shown in FIG. 1A, a hard mask 12 is formed on the substrate 10, wherein the hard mask 12 may be a single layer structure or a multiple layer structure. The material of the hard mask comprises silicon oxide or silicon nitride, but not limited thereto. For example, the hard mask may be a tri-layer structure, including a lower hard mask 12A consisting of silicon oxide, a middle hard mask 12B consisting of silicon nitride and an upper hard mask 12C consisting of silicon oxide, but not limited thereto.

A plurality of sacrificial patterns 14 are formed on the substrate 10. In this embodiment, the method of forming the sacrificial patterns 14 is integrated into a gate process. For example, a gate process can be performed to form a plurality of sacrificial gates which serve as the sacrificial patterns 14 on the substrate 10, but it is not limited thereto. In one case, the sacrificial patterns 14 are polysilicon gates, but the material is not restricted therein. In, addition, the sacrificial patterns 14 are arranged along a first direction (such as X-axis) and parallel to each other.

Figure 1B:
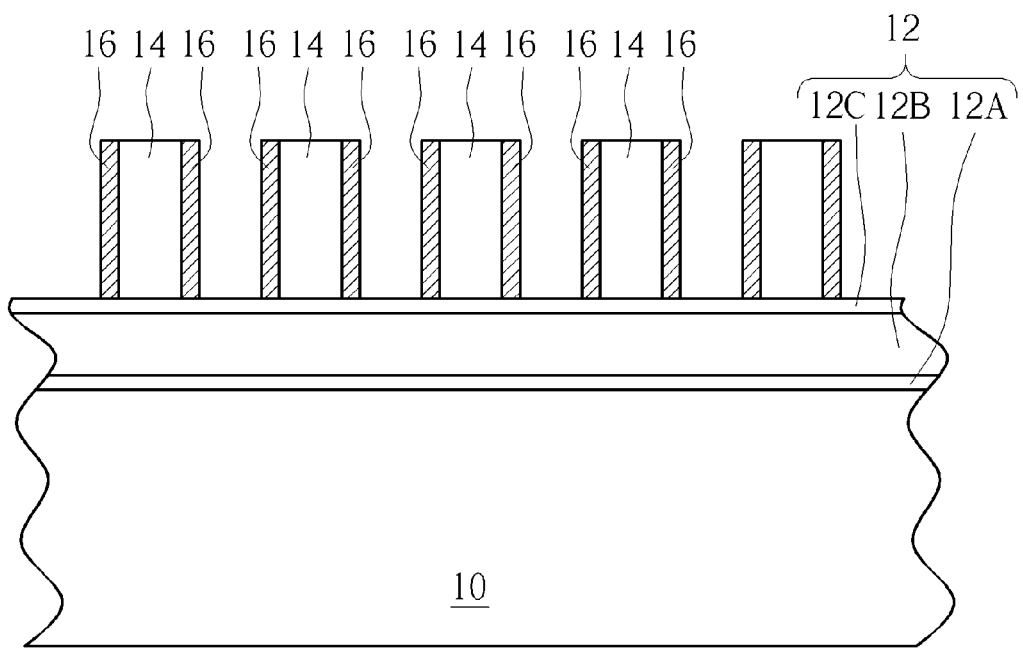

Afterwards, as shown in FIG. 1B, a plurality of spacers 16 is formed on the substrate 10 next to the sacrificial patterns 14. More precisely, a spacer material (not shown) conformally covers the sacrificial patterns 14 and the hard mask 12, and the spacer material is then etched to form the spacers 16. This step can be integrated into a gate process. The spacers 16 may be nitride spacers, but are not limited thereto. The spacer 16 may be composed of materials having etching selectivity to the material of the sacrificial patterns 14, and the spacers 16 may be composed of multi dielectric layers.

Figure 1C:
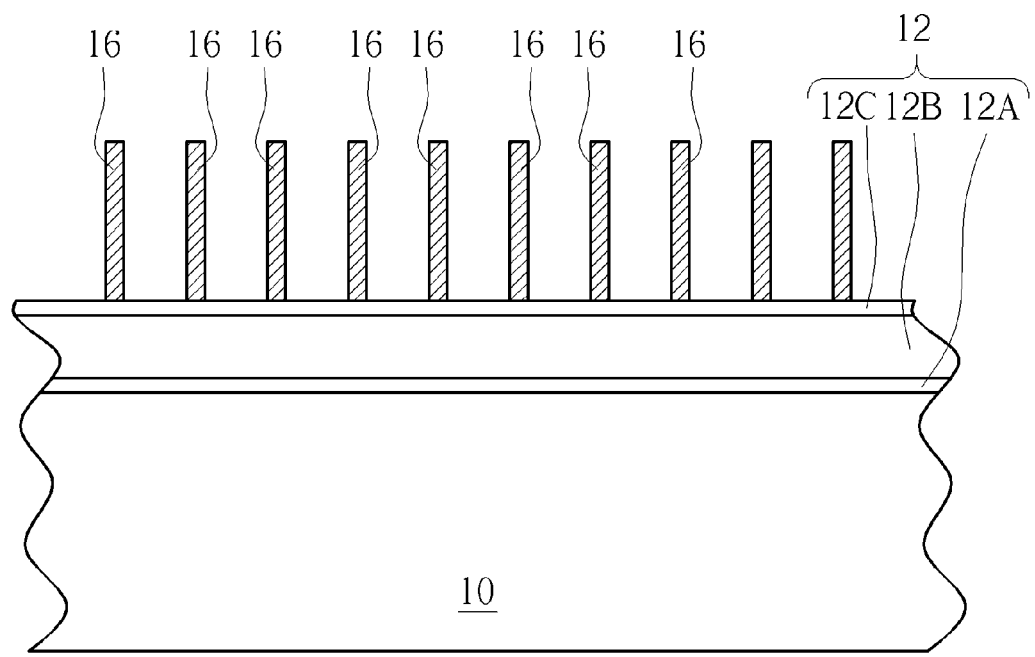

As shown in FIG. 1C, the sacrificial patterns 14 are then removed, so the spacers 16 remain on the substrate 10 and the parts of the hard mask 12 directly below the sacrificial patterns 14 are exposed.

Figure 1D:
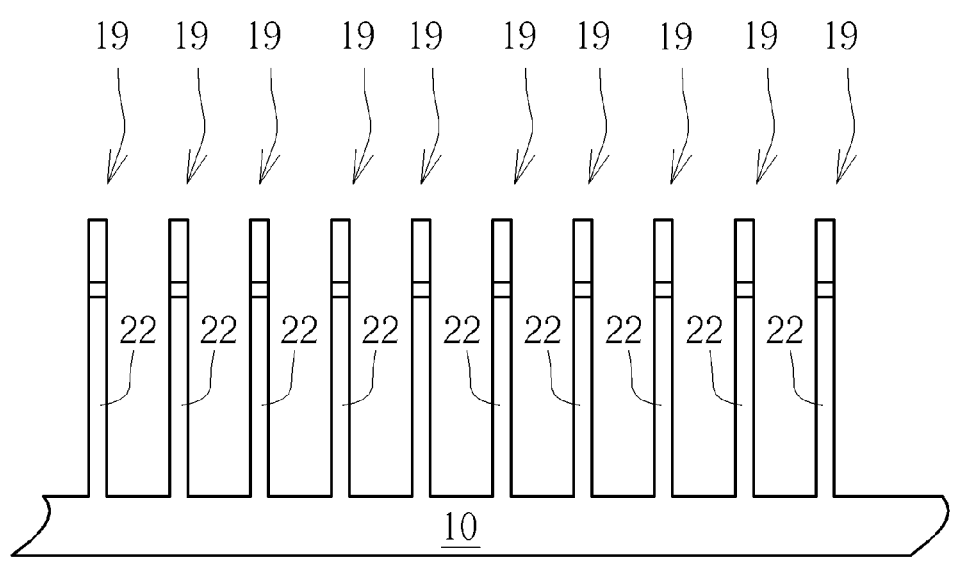
Figure 2:
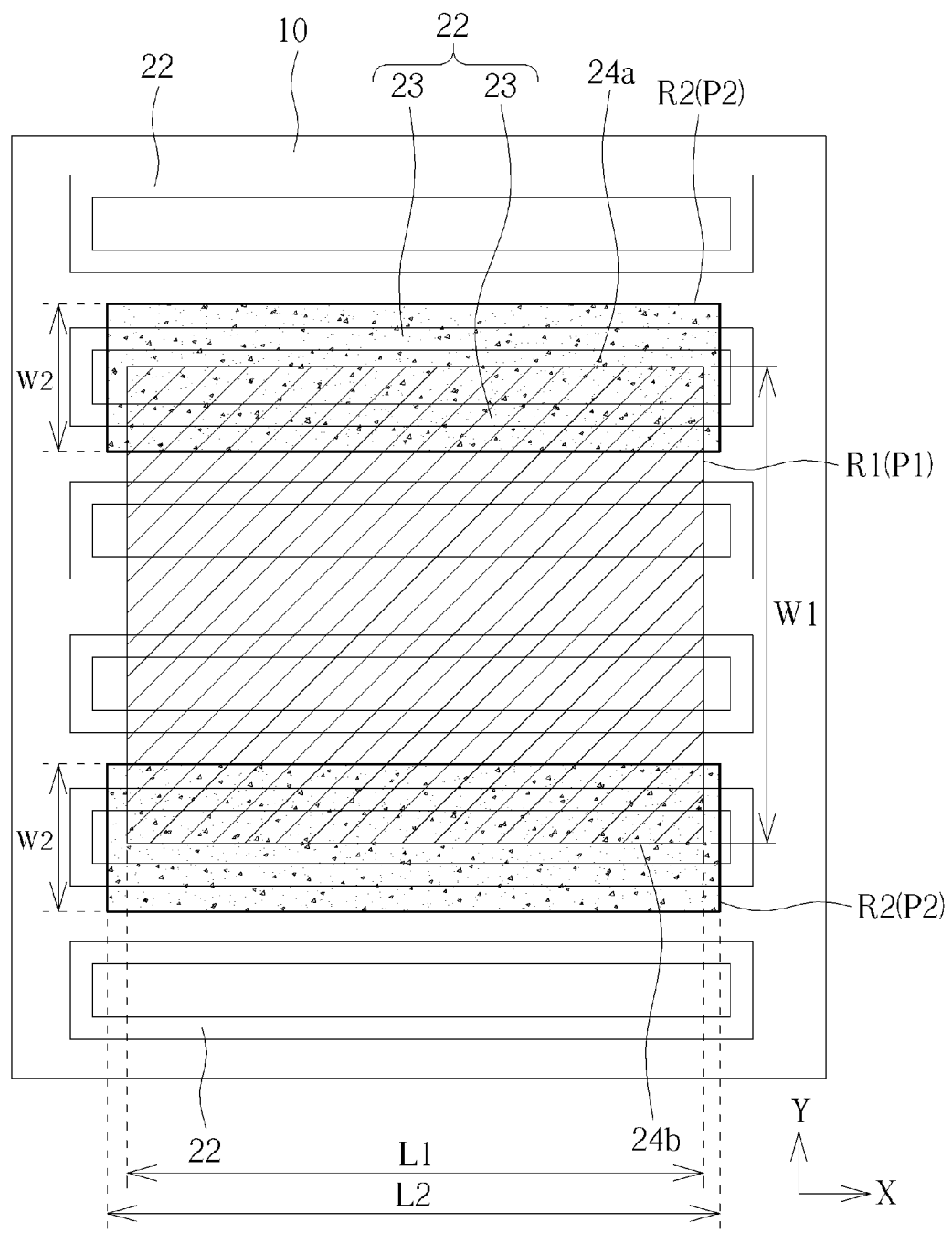
FIGS. 2-3 are the top view diagrams according to the first preferred embodiment of the present invention.

As shown in FIG. 1D, a pattern transferring process is then performed, so that the pattern of the spacers 16 is transferred to hard mask 12 to form a plurality of patterned hard masks. For instance, an etching process (not shown) is performed to etch the hard mask 12 by using the spacers 16 to serve as hard masks; thereby, the plurality of patterned hard masks 19 are formed on the substrate 10. The etching process may be a dry etching process, a wet etching process, or a sequentially performed dry and wet etching process, etc. Afterwards, another etching process is then performed, to transfer the pattern of patterned hard masks 19 into the substrate 10 disposed below, so as to form a plurality of fin structures 22. Besides, in this embodiment, the patterned hard masks 19 may remain on the fin structures 22, but not limited thereto. Since the patterned hard masks 19 may be consumed during the etching process, in another case the fin structures 22 do not comprise the patterned hard masks 19 disposed thereon. However, parts of the patterned hard masks 19 preferably remain to protect the fin structures 22, and in the following steps, an etching back process is then performed so as to expose the top surface of each fin structure 22.STI After the fin structures 22 are formed on the substrate 10 (as shown in FIG. 1 again), in order to form a desired layout of the fin structures, a cutting process is then performed, to remove parts of the fin structures 22. More precisely, after the SIT process, each fin structure 22 may be a rectangle frame-shaped structure when viewed in top view, and the following fin cut process will remove parts of the rectangle frame-shaped fin structure 22, so as to separate each rectangle frame-shaped fin structures 22 into two strip-shaped fins 23, and to keep those strip-shaped fins 23 as needed. For example, as shown in FIGS. 1-2, a first fin cut process P1 is then performed, so as to remove parts of the fin structures 22 on the substrate 10. It is noteworthy that the first fin cut process P1 such as a photolithography process and an etching process, and only etches a specific region on the substrate 10. In this embodiment, the first fin cut process P1 is only performed outside of a first fin cut region R1. In other words, a protective layer (such as a hard mask) is covered on the first fin cut region R1, and the fin structures 22 that are disposed outside of the first fin cut region R1 will be removed during the first fin cut process P1, and the fin structures 22 that are disposed within the first fin cut region R1 will be protected, such as being protected by a photoresist layer or a hard mask, and will not be removed during the first fin cut process P1.

However, in manufacturing process for forming a large-size device, since there are a lot of fin structures 22 disposed on the substrate 10, the critical dimension of the first fin cut region R1 is difficult to be controlled well. Therefore, the predicted fin structures removed number may be different from the actual fin structures removed number during the first fin cut process P1. For example, the predicted amount of the fin structures that is to be removed during the first fin cut process P1 is N, but after the first fin cut process P1, the actual amount of the fin structures being removed may be N±e, wherein e is the error during the process, and the error occurs and thereby influences the performance of the semiconductor device.

In order to control the critical dimension more precisely, the present invention further comprises performing a second fin cut process P2 after the first fin cut process is performed. Please refer to FIG. 2, the second fin cut process P2 is further performed after the first fin cut process P1 is performed, involving removing the fin structure within specific regions, such as within the second fin cut regions R2. It is noteworthy that the second fin cut regions R2 are arranged along the first direction (such as X-axis), and also arranged along at least one the edge of the first fin cut region R1. Besides, the second fin cut region R2 may partially overlap with the first fin cut region R1, and at least one strip-shaped fin 23 is disposed within the overlapped region of the first fin cut region R1 and the second fin cut region R2. In this embodiment, the second fin cut region R2 disposed along an upper edge 24a of the first fin cut region R1 and a lower edge 24b of the first fin cut region R1, and the width W1 of the first fin cut region R1 is larger than the width W2 of the second fin cut region R2. In other words, the first fin cut region R1 has larger critical dimension than the second fin cut region R2 does. Besides, in this embodiment, the length of each second fin cut region L2 is preferably larger than the length of each first fin cut region L1.

In the present invention, after the first fin cut process P1 is performed, parts of the fin structures 22 are removed. However, since the first fin cut region R1 has a larger critical dimension, the amount for removing the fin structures is hard to be controlled well. Therefore, the present invention further comprises the second fin cut process P2 after the first fin cut process P1 is performed, so as to further "modify" the edge region of the first fin cut region R1. For example, the predicted amount number of the remaining strip shaped fins 23 after the whole etching process (the first fin cut process and the second fin cut process) is N, but the actual number of the remaining strip shaped fins after the first fin cut process is N+e, wherein e is the error during the first fin cut process P1. In this way, since the size of the second fin cut region can be controlled well, the second fin cut process P2 can remove e number of the fin structures precisely, and correct the error during the first fin cut process P1.

Figure 3:
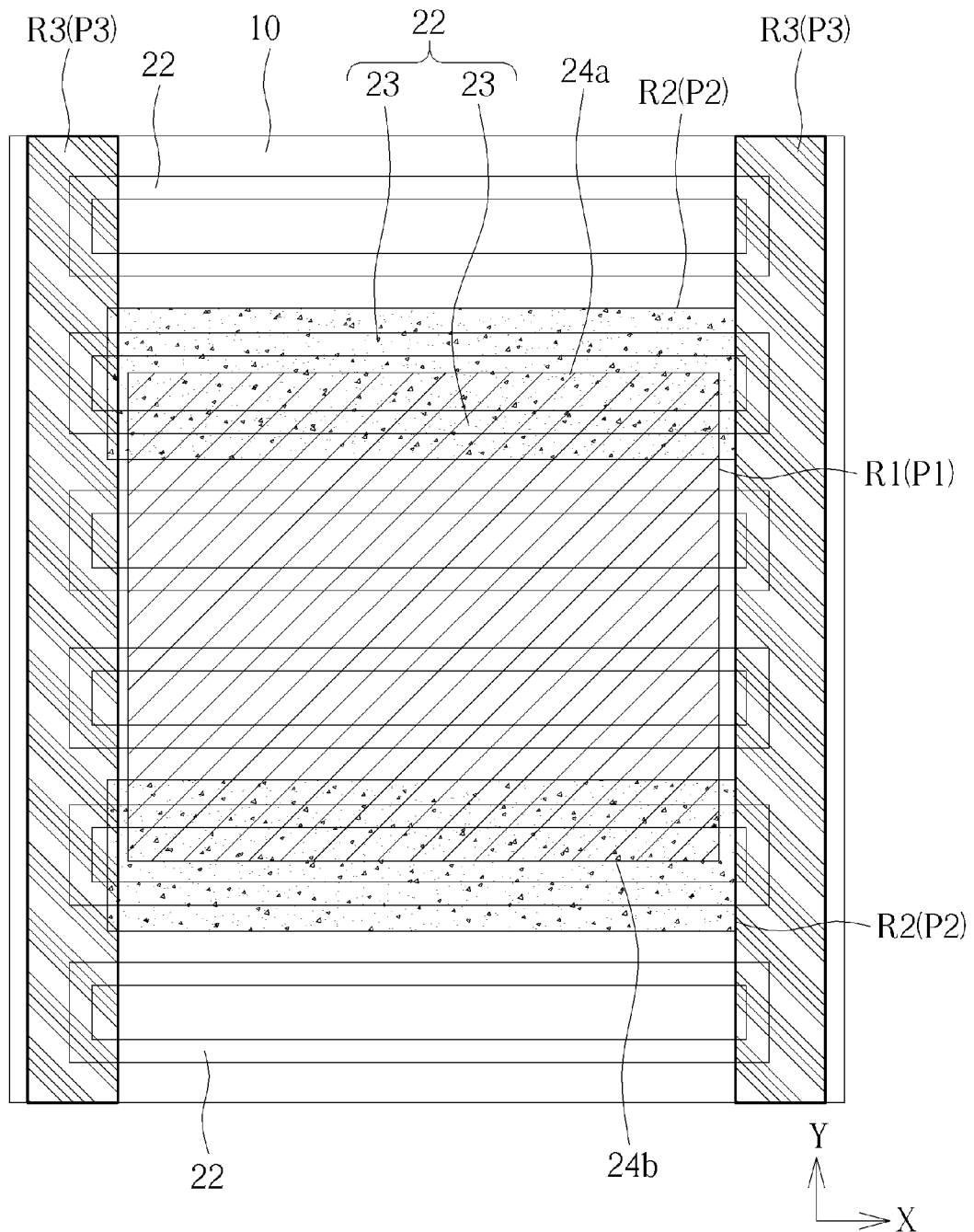

Please refer to FIG. 3. The present invention further comprises performing a third fin cut process P3. Similar to the first fin cut process P1 or the second fin cut process P2, the third fin cut process P3 also removes the fin structures within specific regions, such as the third fin cut regions R3. It is noteworthy that the third fin cut regions R3 are arranged along a second direction which is perpendicular to the first direction (such as Y-axis), and preferably, the third fin cut region R3 is disposed on two ends of each rectangular frame-shaped fin structure 22, so as to separate each rectangular frame-shaped fin structure 22 to two strip shaped fins 23. Besides, in this embodiment, the third fin cut process P3 and the second fin cut process P2 can be performed simultaneously, but not limited thereto. In another embodiment of the present invention, the third fin cut process P3 can be performed with the first fin cut process P1 (the third fin cut process P3 and the first fin cut process P1 are performed simultaneously), or the first fin cut process P1, the second fin cut process P2, and the third fin cut process P3 are performed in different steps respectively. Those situations should also be within the scope of the present invention.

Furthermore, in the embodiment mentioned above, the first fin cut process P1 is performed after the rectangle frame-shaped fin structures 22 are formed, but in the present invention, the first fin cut process P1 can be performed at different times, such as being performed after the spacer 16 is formed (please refer to FIG. 1B), or being performed after the sacrificial patterns 14 are removed (please refer to FIG. 1C), and those embodiments should be within the scope of the present invention.

Figure 4:
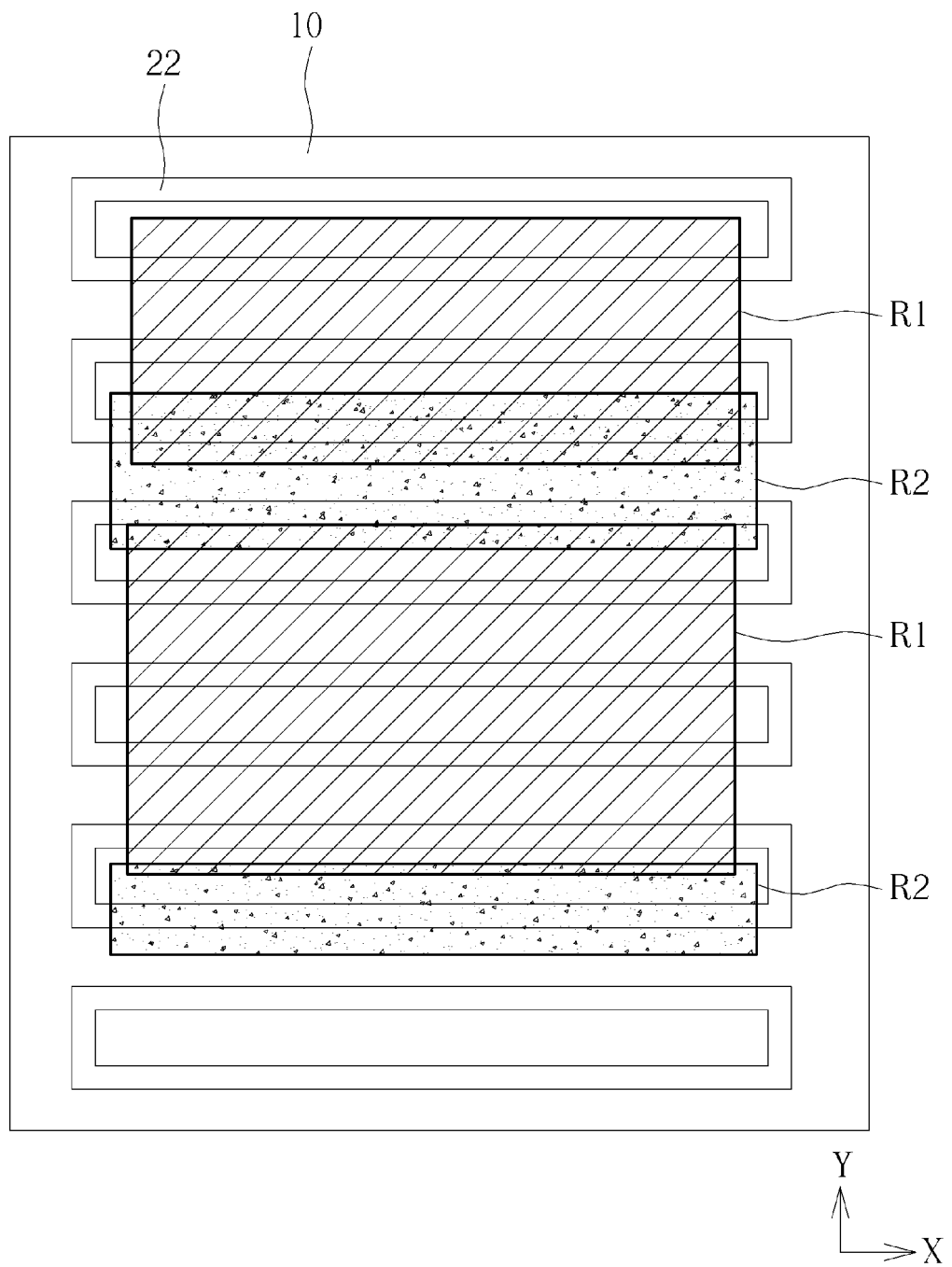
FIG. 4 is a top view diagram according to the second preferred embodiment of the present invention.

Please refer to FIG. 4, which shows the second preferred embodiment of the present invention. Similar to the first preferred embodiment mentioned above, the second preferred embodiment also comprises a plurality of fin structures 22 disposed on the substrate 10, and performing the first fin cut process P1, the second fin cut process P2 and the third fin cut process P3, so as to define the first fin cut region R1, the second fin cut region R2 and the third fin cut region R3 respectively, wherein the second fin cut region R2 is disposed along at least one edge of the first fin cut region R1. The difference between this embodiment and the first preferred embodiment is that the embodiment comprises a plurality of first fin cut regions R1 and a plurality of second fin cut regions R2, and the first fin cut regions R1 and the second fin cut regions R2 are arranged alternately. In the present invention, the size of each second fin cut region R2 can be adjusted according to actual requirements. The other components, material properties, and manufacturing method of the components of this embodiments are similar to the first preferred embodiment detailed above and will not be redundantly described.

In those embodiments mentioned above, the first fin cut region is a protected area (which is covered by a protective layer), and will not be etched during the first fin cut process. However, the key feature of the present invention is further performing the second fin cut process so as to modify the edge region the first fin cut region, and in the present invention, the first fin cut region is not limited to a protected area. It may also comprise an etching area (which is etched during the first fin cut process), and this should be within the scope of the present invention.

In summary, the present invention provides a method for forming a semiconductor structure, which at least comprises the first fin cut process P1 and the second fin cut process P2. After the first fin cut process P1 is performed, parts of the fin structures are removed, but the critical dimension of the first fin cut region R1 is still relatively rough. Therefore the second fin cut process P2 is further performed, so as to modify the edge region of the first fin cut region R1, and to control the critical dimension better, thereby improving the quality of the semiconductor devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for forming a semiconductor structure, comprising the following steps:

providing a substrate, a hard mask being disposed on the substrate;

patterning the hard mask to form a plurality of fin hard masks;

performing a pattern transferring process, to transfer the patterns of the fin hard masks into the substrate, so as to form a plurality of fin structures on the substrate and arranged along a first direction;

after the fin structures are formed, performing a first fin cut process, so as to define a first fin cut region, wherein the first fin cut process comprises forming a hard mask within the first fin cut region, and performing an etching process so as to remove the fin structures completely which are disposed outside of the first fin cut region; and performing a second fin cut process, so as to define a second fin cut region, wherein the second fin cut process comprises performing a second fin cut process, so as to remove the fin structures completely which are disposed within the second fin cut region, and, the second fin cut region is disposed along at least one edge of the first fin cut region, and the first fin cut region and the second fin cut region are arranged along the first direction.

2. The method of claim 1, wherein the second fin cut region partially overlaps with the first fin cut region, and at least one fin structure is disposed within the overlapped region between the first fin cut region and the second fin cut region.

3. The method of claim 1, wherein before the first fin cut process is performed, each fin structure is a rectangular frame-shaped structure.

4. The method of claim 1, further comprising performing a third fin cut process, so as to remove parts of the fin structures which are disposed within a third fin cut region.

5. The method of claim 4, wherein the third fin cut region is arranged along a second direction, the first direction and the second direction being arranged orthogonally.

6. The method of claim 4, wherein the first fin cut process and the third fin cut process are performed simultaneously.

7. The method of claim 4, wherein the second fin cut process and the third fin cut process are performed simultaneously.

8. The method of claim 1, wherein the second fin cut process is performed after the first fin cut process is performed.

9. The method of claim 1, wherein the first fin cut regions and the second fin cut regions are arranged alternately.

10. The method of claim 1, wherein the method for forming the fin hard mask comprises a sidewall image transfer process.

* * * * *